United States Patent [19]

Nawaki et al.

[11] Patent Number: 4,916,661
[45] Date of Patent: Apr. 10, 1990

[54] SEMICONDUCTOR MEMORY DEVICE WITH BIT LINE PAIRS CROSSED AT LEAST ONCE WITH RESPECT TO EACH OTHER

[75] Inventors: Masaru Nawaki, Nara; Hirofumi Higashino; Tomoyuki Tagami, both of Tenri, all of Japan

[73] Assignee: Sharp Kabushiki Kaisha, Osaka, Japan

[21] Appl. No.: 326,434

[22] Filed: Mar. 17, 1989

Related U.S. Application Data

[63] Continuation of Ser. No. 131,589, Dec. 11, 1987, abandoned.

[30] Foreign Application Priority Data

Dec. 17, 1986 [JP] Japan ................................ 61-302376

[51] Int. Cl.$^4$ ...................... G11C 11/40; G11C 13/00
[52] U.S. Cl. ........................................ 365/51; 365/63; 365/202; 365/190
[58] Field of Search .................. 365/51, 202, 190, 154, 365/70, 69, 205, 63

[56] References Cited

U.S. PATENT DOCUMENTS

| | | | |
|---|---|---|---|
| 3,942,164 | 3/1976 | Dunn | 365/63 X |
| 4,476,547 | 10/1984 | Miyasaka | 365/149 |
| 4,586,171 | 4/1986 | Fujishima | 365/205 X |
| 4,675,845 | 6/1987 | Itoh et al. | 365/51 X |
| 4,748,591 | 5/1988 | Itoh et al. | 365/51 X |

FOREIGN PATENT DOCUMENTS

| | | | |
|---|---|---|---|
| 0167281 | 1/1986 | European Pat. Off. | 365/51 |
| 60-254489 | 12/1985 | Japan | 365/149 |

Primary Examiner—Stuart N. Hecker
Assistant Examiner—Alfonso Garcia
Attorney, Agent, or Firm—Flehr, Hohbach, Test, Albritton & Herbert

[57] ABSTRACT

A semiconductor memory device of the type with a plurality of bit line pairs and signal lines disposed parallel to these bit line pairs is characterized in that two bit lines forming a pair are crossed at least once in the middle to prevent capacitance imbalance caused by misalignment of the associated signal line.

5 Claims, 3 Drawing Sheets

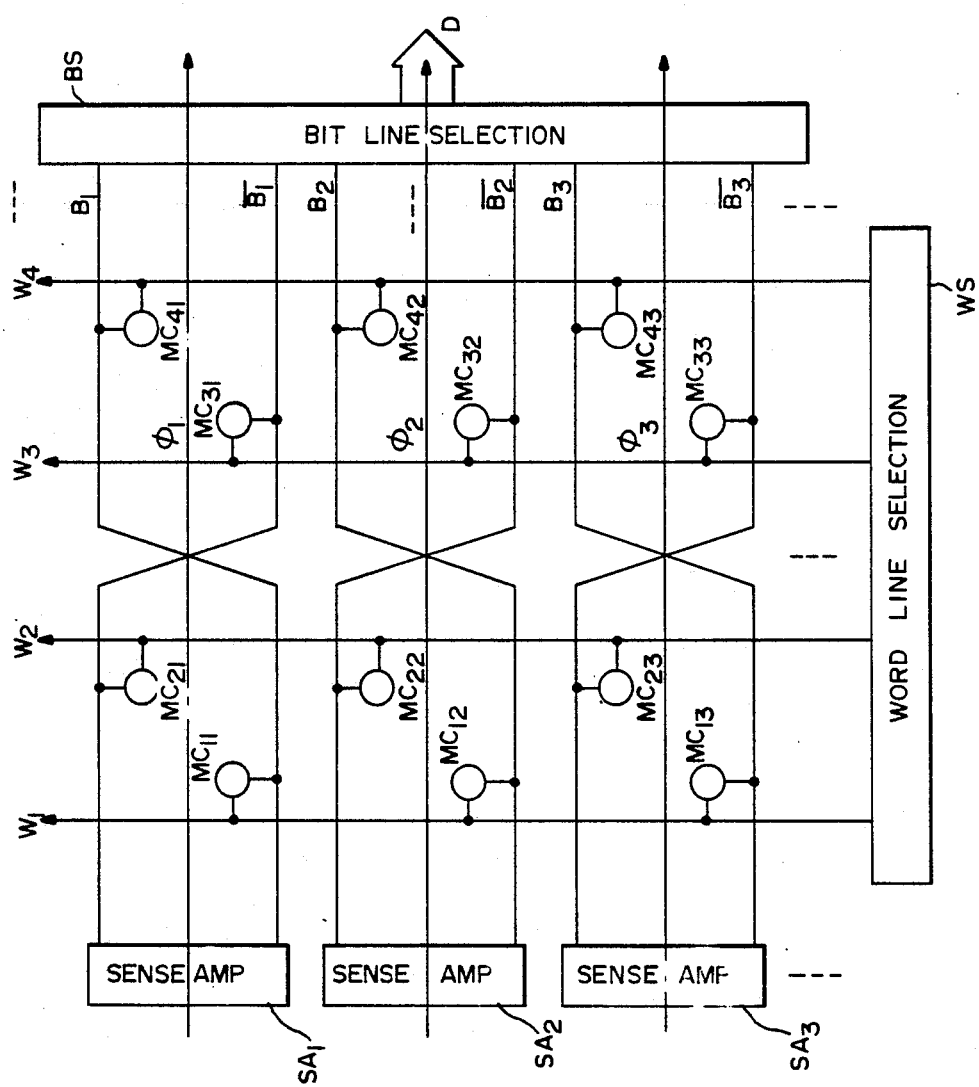
FIG.—1

SEMICONDUCTOR MEMORY DEVICE WITH BIT LINE PAIRS CROSSED AT LEAST ONCE WITH RESPECT TO EACH OTHER

This is a continuation of Application Ser. No. 131,589 filed Dec. 11, 1987, now abandoned.

BACKGROUND OF THE INVENTION

This invention relates to a semiconductor memory device with a plurality of pairs of bit lines and signal lines disposed parallel to these bit line pairs, and more particularly to a semiconductor memory device of this type which is designed to prevent instability in the action of the bit lines and lowering of the action margin of the circuit caused by the mask misalignment and the resultant difference in the inter-line capacitance between a signal line and two bit lines of a pair corresponding to the signal line.

A semiconductor memory device generally has a large number of memory cells arranged in a matrix formation within one semiconductor chip and an address signal is applied to select a desired memory cell to write a data item in this memory cell or read the data item stored therein. FIG. 2 shows a conventional arrangement of bit lines in a DRAM (dynamic random-access memory) of the type with pairs of bit lines. Many bit line pairs ($B_1'$, $\overline{B_1'}$), ($B_2'$, $\overline{B_2'}$), etc. are disposed parallel to one another and many mutually parallel word lines $W_1'$, $W_2'$, etc. are disposed perpendicularly to these bit line pairs, memory cells $MC_{11}'$, $MC_{12}'$, etc. being connected to each crossing point between a bit line pair and a word line. In addition, there are signal lines $\phi_1'$, $\phi_2'$, etc. made of a different material from the bit lines and each disposed with one of the bit line pairs. They are used for controlling a bit line selection circuit BS' and also for other control purposes. In FIG. 2, WS' indicates a word line selection circuit, $SA_1'$, $SA_2'$, etc. indicate sense amplifiers and D' indicates data. When one of the memory cells is selected and the data item stored therein is read, the small voltage difference generated between the corresponding bit lines $B_i'$ and $\overline{B_i'}$ is amplified by the associated sense amplifier $SA_i'$. Since it is desirable in this situation that the parasitic capacitances of the lines $B_i'$ and $\overline{B_i'}$ be as closely equal to each other as possible, the corresponding signal line $\phi_i'$ is so laid out as to be at the center of this bit line pair ($B_i'$, $\overline{B_i'}$) such that the inter-line capacitances between the bit lines $B_i'$ and $\overline{B_i'}$ and the signal line $\phi_i'$ are also equal to each other. In reality, however, misalignments and errors in matching mask positions are inevitable in the production of semiconductor devices. As a result, the signal line $\phi_i'$ is closer to either of the bit lines $B_i'$ and $\overline{B_i'}$ associated thereto and an imbalance is generated between the capacitances of the lines $B_i'$ and $\overline{B_i'}$. This imbalance in capacitance causes the lowering of the sensitivity of the sense amplifier $SA_i'$ and eventually the action margin of the device as a whole.

SUMMARY OF THE INVENTION

It is therefore an object of the present invention to overcome the problems described above by providing a semiconductor memory device in which no imbalance is caused between the capacitances of bit lines forming a pair and the margin of the sense action is not lowered even if the signal line disposed parallel to this bit line pair is misaligned. The above and other objects of the present invention are achieved by crossing the two bit lines of each pair in the middle.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings:

FIG. 1 is a drawing showing the structure of a DRAM embodying the present invention.

DETAILED DESCRIPTION OF THE INVENTION

The DRAM of the type with many bit line pairs embodying the present invention and shown in FIG. 1 is characterized as having every pair of bit lines $B_i$ and $\overline{B_i}$ (forming a bit line pair) crossed at the center. If this is done, the inter-line capacitances between the pair of bit lines $B_i$ and $\overline{B_i}$ and the signal line $\phi_i$ made of a completely different material from the bit lines are completely equal even with a mask misalignment. This is explained in detail below regarding the bit line pair ($B_1$, $\overline{B_1}$). In FIG. 1, $W_1$, $W_2$, etc. indicate word lines, $MC_{11}$, $MC_{12}$, etc. indicate memory cells, WS indicates a word line selection circuit, $SA_1$, $SA_2$, etc. indicate sense amplifiers, BS indicates a bit line selection circuit and D indicates data.

Figure 3:
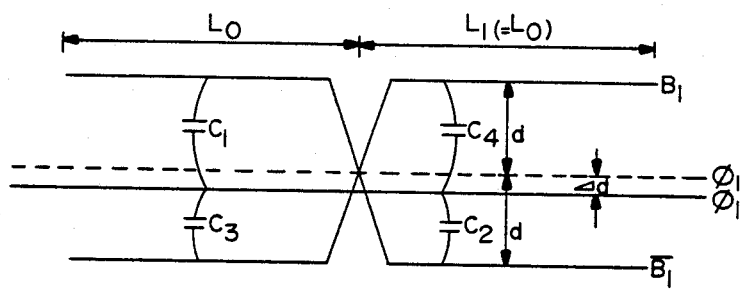
FIG. 3 is a drawing showing that imbalance in bit line capacitances does not occur in the DRAM of FIG. 1, and FIGS. 4, 5 and 6 are drawings showing other structures embodying the present invention.

With reference to FIG. 3 which shows the distance relationship between the signal line $\phi_1$ and the bit lines $B_1$ and $\overline{B_1}$, $\Delta d$ indicates the misalignment of the signal line $\phi_1$ (shown by a solid line) from its layout position (shown by a broken line) and $C_1$–$C_4$ indicate inter-line capacitances per unit length of the signal line $\phi_1$. Let C represent the value of $C_1$–$C_4$ when there is no misalignment and the bit lines $B_1$ and $\overline{B_1}$ and the signal line $\phi_1$ are completely symmetric. Then, since these capacitances are inversely proportional to distance, $C_1 = C_4 = dC/(d+\Delta d)$ and $C_2 = C_3 = dC/(d-\Delta d)$. Thus, the inter-line capacitance between the bit line $B_1$ and the signal line $\phi_1$ is $C_3 + C_4$ and is equal to that between the bit line $\overline{B_1}$ and the signal line $\phi_1$ which is $C_1 + C_2$.

Figure 6:
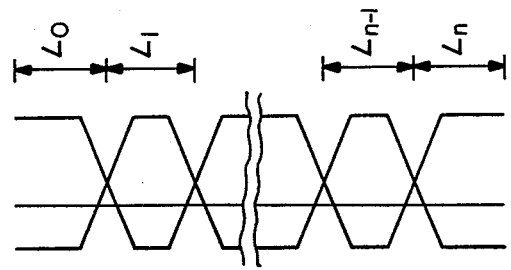
Figure 2:
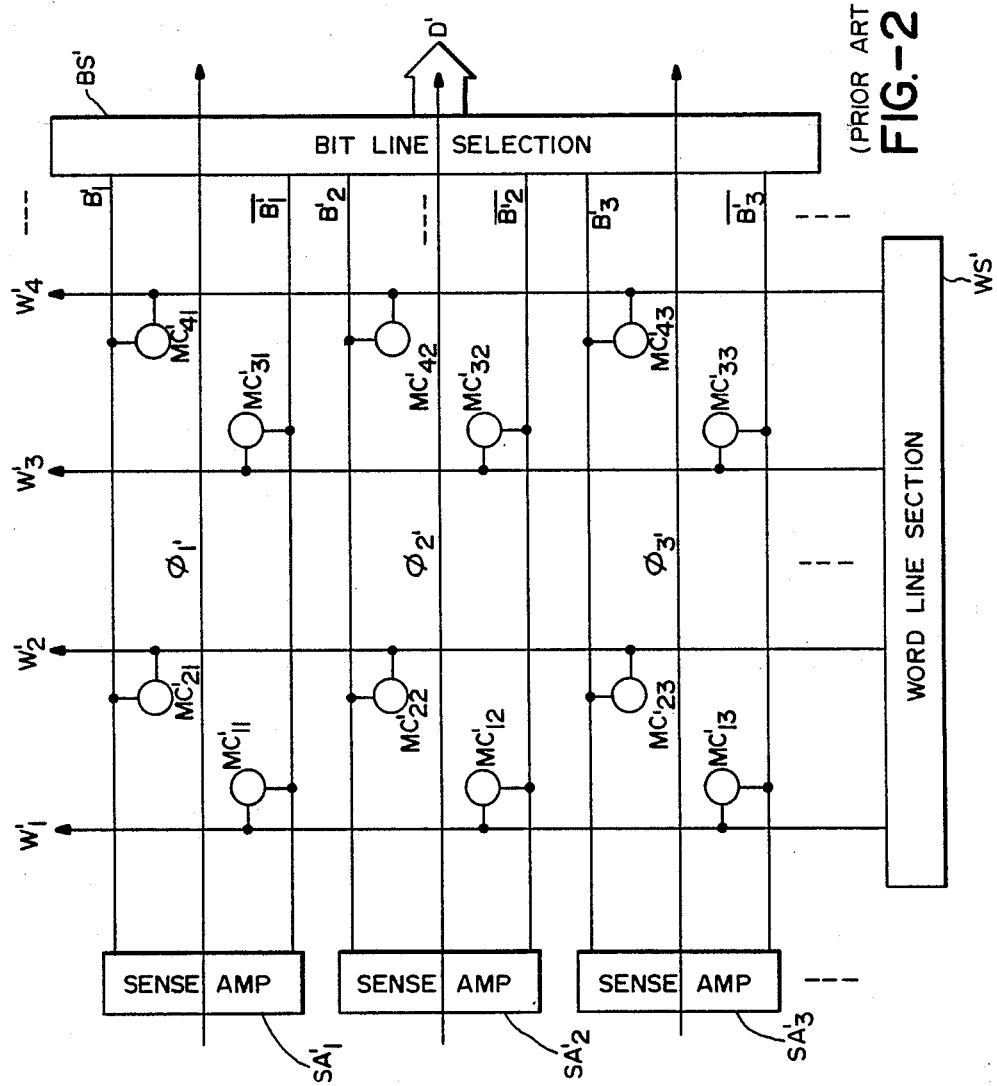
FIG. 2 is a drawing showing the structure of a conventional DRAM.
Figure 4:
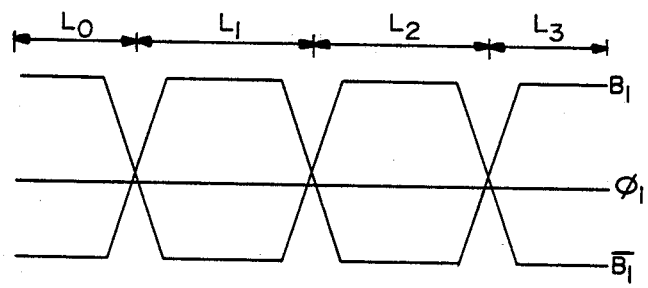

In summary, if the bit lines are crossed as shown above, no misalignment of a signal line placed over this bit line pair does not cause any capacitance imbalance in the bit lines forming the pair and the lowering of the margin of action of the sense amplifier can be prevented. The foregoing description of a preferred embodiment of the invention has been presented for purposes of illustration and description. It is not intended to be exhaustive or to limit the invention to the precise form disclosed, and many modifications and variations are possible in light of the above teaching. For example, the bit lines in each pair may be crossed over more than once instead of just once at the center as shown in FIG. 1. FIG. 4 shows an example where a pair of bit lines are crossed three times. The distances $L_0$, $L_1$, $L_2$ and $L_3$ shown in FIG. 4 satisfy the relationship $L_0+L_2=L_1+L_3$. As long as this relationship holds, no capacitance imbalance occurs between the bit lines $B_1$ and $\overline{B_1}$. In general, if a pair of bit lines are crossed n times and the lengths similarly defined by these crossing points are $L_0, L_1 \ldots L_n$, as shown in FIG. 6 they must satisfy the condition $L_0+L_2+L_4+\ldots+L_n=L_1+L_3+\ldots+L_{n-1}$ if n is even, and $L_0+L_2+\ldots+L_{n-1}=L_1+L_3+\ldots+L_n$ if n is odd. As long as this condition is satisfied, bit lines may be crossed any number of times.

Figure 5:
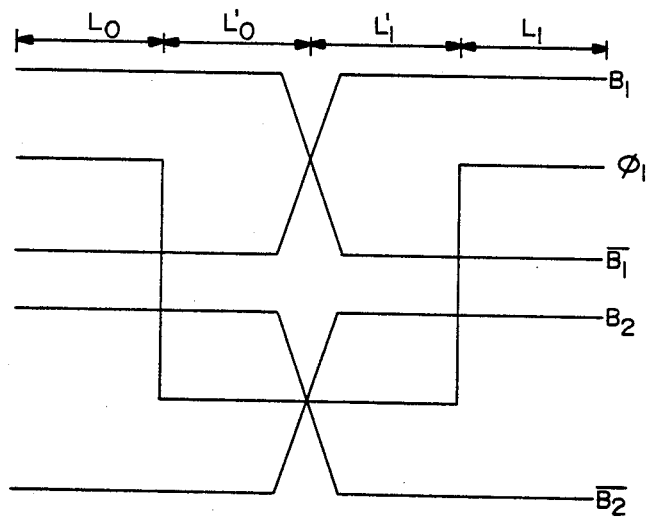

When the number of signal lines $\phi_i$ is smaller than that of bit line pairs ($B_i$, $\overline{B_i}$), a signal line may be distributed among a plurality of bit line pairs as shown in FIG. 5. In this situation, too, conditions $L_0=L_1$, $L_0'=L_1'$, etc. must be satisfied.

What is claimed is:

1. A semiconductor memory device comprising a plurality of bit line pairs which are sequentially aligned longitudinally between two end positions and signal lines made of a different material from bit lines of said bit line pairs, said signal lines being generally longitudinally extending parallel to said bit line pairs between said end positions, the two bit lines in all of said bit line pairs being crossed at least once with respect to each other at one or more same longitudinal positions between said end positions so as to prevent imbalance of parasitic capacitances between said bit line pairs and said signal lines.

2. The semiconductor memory device of claim 1 wherein said two bit lines forming a bit line pair are crossed once at the center.

3. The semiconductor memory device of claim 1 wherein said two bit lines forming a bit line pair are crossed n times, where n is an integer, defining uncrossed segments of lengths $L_0, L_1, \ldots L_n$ sequentially from one of said end positions and wherein $L_0+L_2+\ldots+L_n=L_1+L_3+\ldots L_{n-1}$ if n is even and $L_0+L_2+\ldots+L_{n-1}=L_1+L_3+\ldots+L_n$ if n is odd.

4. The semiconductor memory device of claim 1 wherein each of said signals lines is associated with one of said bit line pairs.

5. The semiconductor memory device of claim 1 wherein there are more of said bit line pairs than said signal lines and each of said signal lines includes one or more segments, each of said segments being longitudinally extending and associated with one of said bit line pairs.

* * * * *

UNITED STATES PATENT AND TRADEMARK OFFICE
CERTIFICATE OF CORRECTION

PATENT NO. : 4,916,661
DATED : April 10, 1990
INVENTOR(S) : Masaru Nawaki, et al.

It is certified that error appears in the above-identified patent and that said Letters Patent is hereby corrected as shown below:

Column 4, Claim 2, line 9, delete "center" and replace with --half-way point between said end positions--.

Signed and Sealed this

Fourteenth Day of May, 1991

*Attest:*

HARRY F. MANBECK, JR.

*Attesting Officer*  *Commissioner of Patents and Trademarks*